(12) United States Patent
Ikeda

(10) Patent No.: US 10,870,916 B2
(45) Date of Patent: Dec. 22, 2020

(54) GAS SUPPLY MEMBER AND GAS PROCESSING APPARATUS

(71) Applicant: TOKYO ELECTRON LIMITED, Tokyo (JP)

(72) Inventor: Kyoko Ikeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

(21) Appl. No.: 15/922,070

(22) Filed: Mar. 15, 2018

(65) Prior Publication Data

US 2018/0274094 A1    Sep. 27, 2018

(30) Foreign Application Priority Data

Mar. 21, 2017  (JP) ................ 2017-054662

(51) Int. Cl.
| | |
|---|---|
| *C23C 16/40* | (2006.01) |
| *C23C 16/44* | (2006.01) |
| *H01L 21/67* | (2006.01) |
| *C23C 16/455* | (2006.01) |
| *C23C 16/458* | (2006.01) |
| *H01J 37/32* | (2006.01) |
| *H01L 21/687* | (2006.01) |
| *H01L 21/02* | (2006.01) |

(52) U.S. Cl.
CPC ...... *C23C 16/4412* (2013.01); *C23C 16/4584* (2013.01); *C23C 16/4586* (2013.01); *C23C 16/45546* (2013.01); *C23C 16/45551* (2013.01); *C23C 16/45578* (2013.01); *H01J 37/3244* (2013.01); *H01J 37/32458* (2013.01); *H01J 37/32816* (2013.01); *H01L 21/0228* (2013.01); *H01L 21/67017* (2013.01); *H01L 21/67109* (2013.01); *H01L 21/68771* (2013.01)

(58) Field of Classification Search
CPC .......... C23C 16/4412; C23C 16/45578; C23C 16/45546; C23C 16/4586; C23C 16/4584; C23C 16/45551; C23C 16/45563; C23C 16/45544; H01J 37/3244; H01J 37/32816; H01J 37/32458; H01L 21/67109; H01L 21/0228; H01L 21/68771; H01L 21/67017
USPC ....................................... 118/715; 156/345.1
See application file for complete search history.

(56) References Cited

U.S. PATENT DOCUMENTS

| | | | | |
|---|---|---|---|---|
| 8,453,600 | B2 * | 6/2013 | Miyashita | ............. C23C 16/345 |
| | | | | 118/723 E |
| 2017/0051408 | A1 * | 2/2017 | Takagi | ............. C23C 16/45578 |

FOREIGN PATENT DOCUMENTS

| | | |
|---|---|---|
| JP | 2013-197329 A | 9/2013 |
| JP | 2014-145111 A | 8/2014 |
| JP | 2017-28256 A | 2/2017 |

* cited by examiner

*Primary Examiner* — Rudy Zervigon
(74) *Attorney, Agent, or Firm* — Nath, Goldberg & Meyer; Jerald L. Meyer

(57) ABSTRACT

A gas supply member includes a straight flow path having a straight-line shape and a first end to be supplied with a gas, a gas discharge port branched from the straight flow path and a gas circulation path extending along an extension line of the straight flow path, connected to a second end of the straight flow path, and configured to collect foreign substances contained in the gas supplied to the straight flow path.

7 Claims, 20 Drawing Sheets

GAS SUPPLY MEMBER AND GAS PROCESSING APPARATUS

CROSS-REFERENCE TO RELATED APPLICATION

This application is based upon and claims the benefit of priority from Japanese Patent Application No. 2017-054662, filed on Mar. 21, 2017, the entire contents of which are incorporated herein by reference.

TECHNICAL FIELD

The present disclosure relates to a gas supply member capable of collecting a foreign substance contained in gas supplied to a straight flow path, and a gas processing apparatus to which the gas supply member is applied.

BACKGROUND

To manufacture a semiconductor device, a semiconductor wafer (hereinafter, referred to as a wafer) as a substrate is loaded into a reaction vessel that forms a vacuum atmosphere, and a processing gas is supplied to perform various kinds of gas processing such as ALD (Atomic Layer Deposition), CVD (Chemical Vapor Deposition), etching, and the like. An apparatus for performing the gas processing may be configured to perform a process on a plurality of wafers in batches, for example, by forming the reaction vessel in a vertical shape so as to accommodate a substrate holder holding the wafers in a shelf shape and by supplying processing gas to the respective wafers from a gas injector disposed on a lateral side of the substrate holder. The gas injector has a straight flow path that extends in a vertical direction and gas discharge ports that are opened in a cross direction and connected to the straight flow path. The gas discharge ports are distributed in the vertical direction so as to discharge the processing gas to the respective wafers. The gas injector is known in the art.

It has been confirmed that when a process is performed by a gas processing apparatus including the aforementioned gas injector, foreign substances (particles) may adhere to the wafers held on an upper side of a substrate holding part. In performing a film forming process on the wafer, a film is also formed inside the gas injector by the film forming process performed on the wafer, and foreign substances are generated inside the gas injector due to the peeling of the film. When the processing gas is supplied to the gas injector at a relatively high flow rate, the foreign substances are pushed up along the straight flow path by the processing gas and are discharged from the gas discharge ports existing on an upper side of the gas injector. It appears that the foreign substances adhere to the wafer as described above. Further, when the film forming process is not performed, the foreign substances flowing into the gas injector from an upstream side of the gas injector are pushed up along the straight flow path by the processing gas as described above, and are discharged from the gas discharge ports on its upper side. It appears that the foreign substances adhere to the wafer.

In the gas injector described above, a gas discharge port (hereinafter, referred to as an upper gas discharge port) opened upward at an upper end of the gas injector is formed in addition to the gas discharge ports opened in the cross direction. Foreign substances are discharged from the upper gas discharge port. However, in such a configuration, the processing gas discharged from the upper gas discharge port is wasted without being directed toward the wafer, and the foreign substances discharged from the upper gas discharge port collide with and rebound from the wall surface of the reaction vessel, whereby the foreign substances may adhere to the wafer. Therefore, it is insufficient for the gas injector to prevent wafer contamination.

SUMMARY

Some embodiments of the present disclosure provide a technique for preventing foreign substances from being contained in a gas discharged from a gas discharge port branched from a straight flow path.

According to one embodiment of the present disclosure, a gas supply member includes: a straight flow path having a straight-line shape and a first end to be supplied with a gas, a gas discharge port branched from the straight flow path and a gas circulation path extending along an extension line of the straight flow path, connected to a second end of the straight flow path, and configured to collect foreign substances contained in the gas supplied to the straight flow path.

According to another embodiment of the present disclosure, a gas processing apparatus that performs processing by heating a plurality of substrates held in a shelf shape on a substrate holder and supplying a processing gas to the substrates in a vertical reaction vessel in which a vacuum atmosphere is formed includes: a gas supply member including a straight flow path having a straight-line shape extending along a vertical direction and a first end to be supplied with the processing gas, a gas discharge port branched from the straight flow path and having an opening facing a horizontal direction, and a processing gas circulation path extending along an extension line of the straight flow path, connected to a second end of the straight flow path and configured to collect foreign substances contained in the processing gas supplied to the straight flow path.

According to another embodiment of the present disclosure, a gas processing apparatus that performs processing by supplying a processing gas to a substrate mounted on one surface side of a rotary table and heating the substrate, in a reaction vessel in which a vacuum atmosphere is formed includes: a gas supply member including a straight flow path having a straight-line shape to extend in a direction intersecting with a rotation direction of the rotary table on one side of the rotary table and supplied with the processing gas from a first end, a gas discharge port branched from the straight flow path and having an opening facing the one side of the rotary table, and a processing gas circulation path extending along an extension line of the straight flow path, connected to a second end of the straight flow path, and configured to collect foreign substances contained in the processing gas supplied to the straight flow path.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
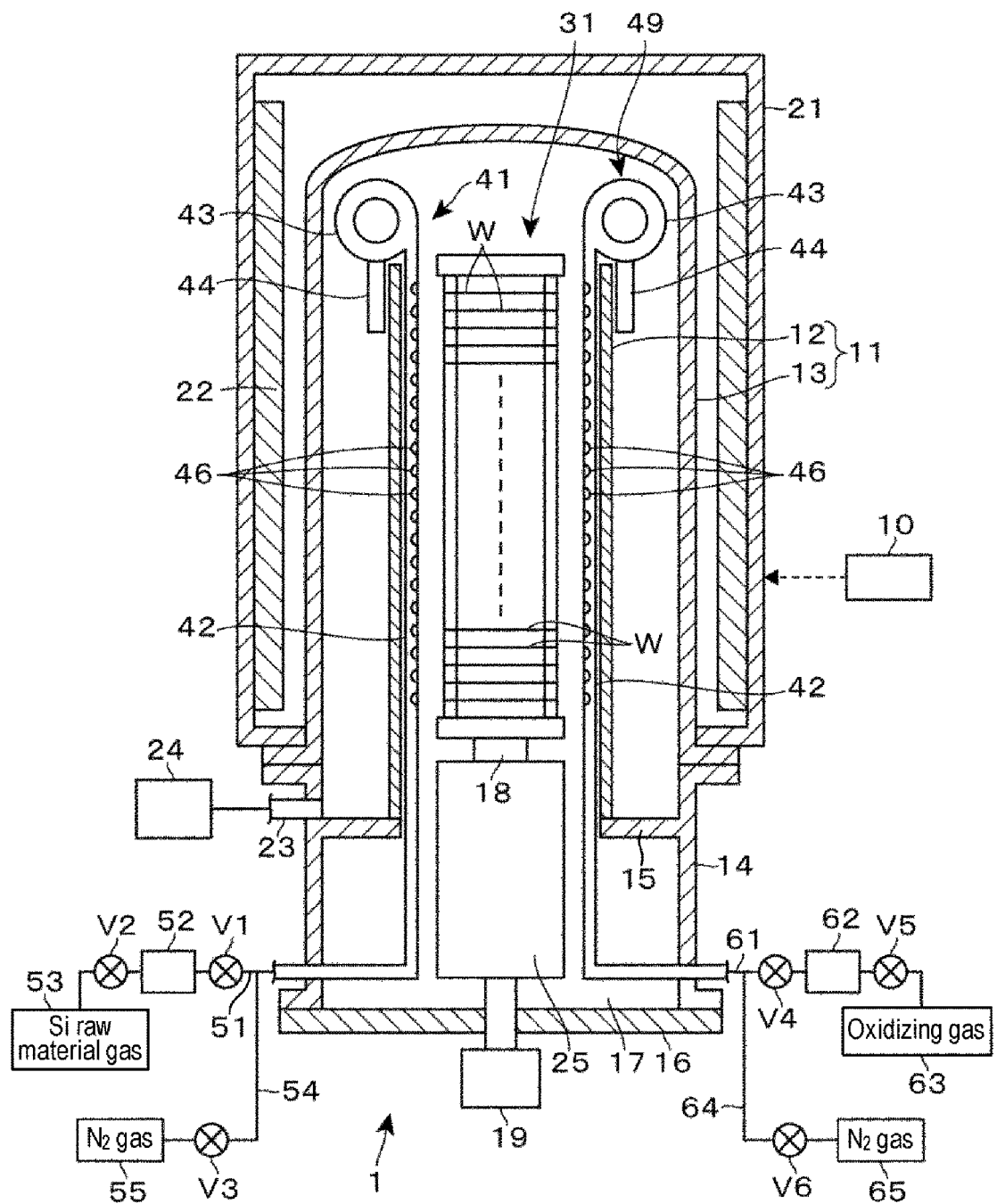
FIG. 1 is a vertical sectional side view of a film forming apparatus to which a gas injector of the present disclosure is applied.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 which is an example of an embodiment of a gas processing apparatus according to the present disclosure will be described with reference to a vertical sectional side view of FIG. 1 and a horizontal sectional side view of FIG. 2. In the film forming apparatus 1, a Si raw material gas containing Si (silicon) such as, for example, trisdimethylaminosilane (3DMAS) or the like, and an oxidizing gas for oxidizing Si such as, for example, ozone ($O_3$) or the like, are alternately supplied to a wafer W, which is a substrate, and an $SiO_2$ film is formed by ALD.

The film forming apparatus 1 includes a reaction vessel 11 which is a substantially cylindrical shaped vertical vessel whose long side direction extends in a vertical direction. The reaction vessel 11 has a double tube structure including an inner tube 12 and an outer tube 13 that is formed to surround the inner tube 12. An upper side of the inner tube 12 is opened, and the outer tube 13 is provided with a ceiling. In the drawings, the gap between the inner tube 12 and the outer tube 13 is exaggeratedly illustrated. A manifold 14 formed in a tubular shape is disposed below the outer tube 13. The manifold 14 is airtightly connected to a lower end of the outer tube 13. Further, the inner tube 12 protrudes from an inner wall of the manifold 14 and is supported by a support ring 15 integrally formed with the manifold 14.

A cover 16 is disposed below the manifold 14. The cover 16 is configured to be vertically movable between a raised position and a lowered position by an elevating mechanism (not illustrated). FIG. 1 illustrates the cover 16 located at the raised position. In this raised position, the cover 16 closes an opening portion 17 of the reaction vessel 11 on a lower side of the manifold 14 to airtightly seal an interior of the reaction vessel 11. A mounting table 18 on which a wafer boat 31 as a substrate holder is loaded is provided above the cover 16. The wafer boat 31 may be loaded into and unloaded from the reaction vessel 11 by raising and lowering the cover 16. When the cover 16 is located at the raised position, the wafer boat 31 is accommodated inside the reaction vessel 11 to be surrounded by the inner tube 12. Reference numeral 19 in the drawings denotes a rotation mechanism for rotating the mounting table 18. Reference numeral 25 in the drawings denotes a heat insulating member interposed between the cover 16 and the mounting table 18.

Describing the wafer boat 31, reference numeral 32 in the drawings denotes three vertical support columns (only two of which are illustrated in FIG. 1) constituting the wafer boat 31. Reference numeral 33 in FIG. 2 denotes mounting portions for the wafer W protruding from the respective support columns 32. The mounting portions 33 are provided in multiple stages in an up-down direction (i.e., the vertical direction). A plurality of wafers W are horizontally loaded on the mounting portions 33 and held in a shelf shape such that lateral positions of the wafers W are aligned with each other. Therefore, upper sides of the respective mounting portions 33 form a substrate holding region. The rotation mechanism 19 rotates the wafer boat 31 with respect to the center axis of the wafer W, which is a vertical axis.

As illustrated in FIG. 1, on an outer side of the reaction vessel 11, a heat insulating body 21 is provided to surround the reaction vessel 11. A heater 22 as a heating part is provided on an inner wall surface of the heat insulating body 21 and may heat the interior of the reaction vessel 11. Further, an upstream end of an exhaust pipe 23 is opened at a side surface of the manifold 14 above the support ring 15 to form an exhaust port in the manifold 14, and a downstream end of the exhaust pipe 23 is connected to a vacuum pump 24 via a pressure regulation part (not illustrated) such as a butterfly valve or the like. With such a configuration, the interior of the reaction vessel 11 is evacuated to a vacuum atmosphere of a desired pressure.

In the drawings, reference numeral 41 denotes a gas injector which is a gas supply member for discharging a Si raw material gas to the wafers W. The configuration of the gas injector 41 will be described with reference to a vertical sectional side view of FIG. 3 and a perspective view of FIG. 4. The gas injector 41 includes a main body portion 42, a circulation path forming portion 43, and a foreign substance accommodation region forming portion 44. The main body portion 42 is formed a rod shape, and its base end is provided outside the manifold 14. A distal end side of the main body portion 42 is horizontally extended into the manifold 14 and is then bent upward. The main body portion 42 is configured to vertically extend upward along the wall surface of the inner tube 12 inside the inner tube 12.

The circulation path forming portion 43 is formed in an upright annular shape and is positioned above the inner tube 12. The distal end of the main body portion 42 is connected to one end portion in a cross direction of the circulation path forming portion 43 when the circulation path forming portion 43 is viewed in an opening direction. The other end portion in the cross direction of the circulation path forming portion 43 is located outside the inner tube 12. Accordingly, the circulation path forming portion 43 is provided between an upper end of the inner tube 12 and the ceiling of the outer tube 13. The circulation path forming portion 43 protrudes outward from the inner side of the inner tube 12 in a top view. In addition, the foreign substance accommodation region forming portion 44 protrudes downward from a lower end portion of the circulation path forming portion 43. The foreign substance accommodation region forming portion 44 is provided to be positioned between the inner tube 12 and the outer tube 13.

Figure 3:
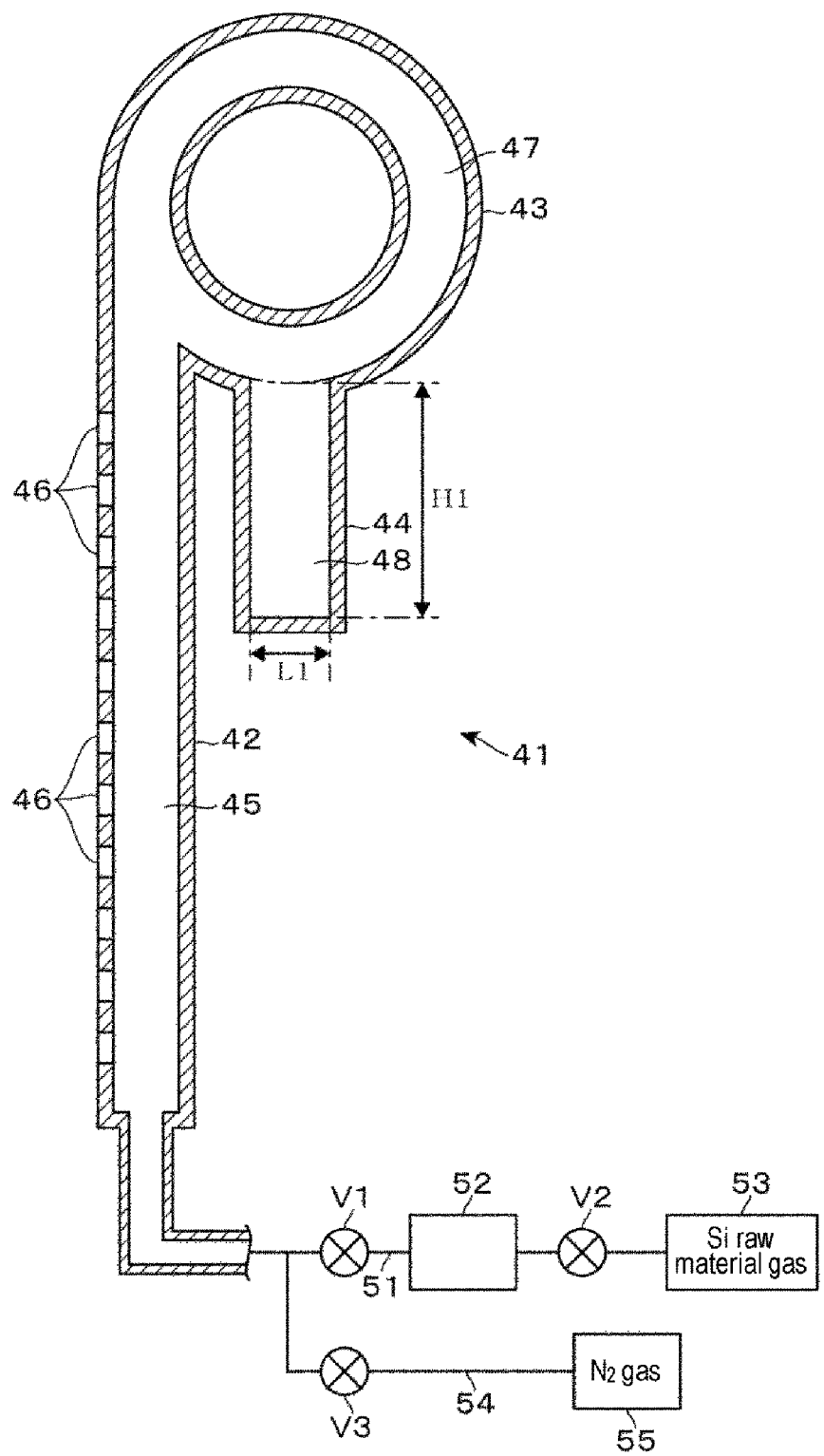
FIG. 3 is a vertical sectional side view of a gas injector provided in the film forming apparatus
Figure 4:
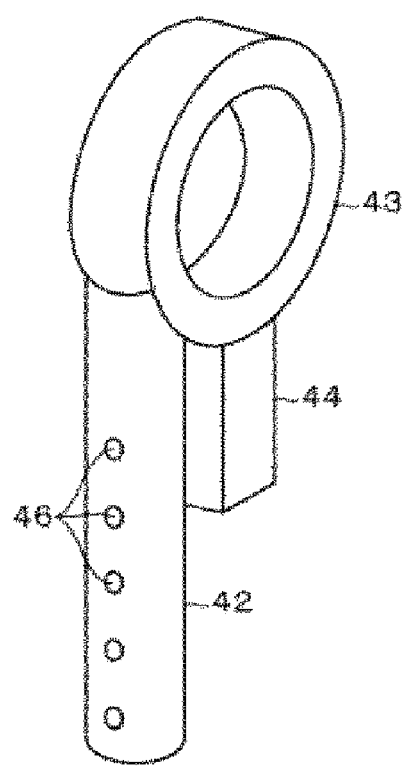
FIG. 4 is a perspective view of the gas injector.

As will be described later, gas is supplied to the main body portion 42 from the base end of the main body portion 42. A flow path for the gas is formed in the main body portion 42 along a long side direction of the main body portion 42. In FIG. 3, a straight flow path formed in a vertically extending region of the main body part 42 is denoted by 45. In the vertically extending region of the main body portion 42, a plurality of gas discharge ports 46 for discharging the gas supplied to the straight flow path 45 toward the wafers W are horizontally opened at intervals in the up-down direction (vertical direction). Accordingly, the gas discharge ports 46 are flow paths formed to branch from the straight flow path 45. In a top view, the gas discharge ports 46 are opened in a direction opposite to the protruding direction of the circulation path forming portion 43 from the main body portion 42. In addition, each of the plurality of gas discharge ports 46 is formed at a height position corresponding to each of the plurality of wafers W held by the wafer boat 31, such that gas may be supplied to the surface of each of the plurality of wafers W.

A cavity, at the interior of the circulation path forming portion 43, is connected to the straight flow path 45, and forms a circulation path 47 which is formed in a circular shape to circulate gas in the vertical direction. The circulation path 47 extending along an extension direction of the straight flow path 45 is connected to a downstream side of the straight flow path 45 by connecting the main body portion 42 and the circulation path forming portion 43 as described above. The expression "the circulation path 47 extending along an extension direction of the straight flow path 45" means that a flow path that forms an extension line of the straight flow path 45 is gradually bent toward the downstream side, and an end portion of the extension line is connected to an end portion of the straight flow path 45, i.e., a base end of the extension line, thereby forming the circulation path 47. In other words, the expression "the circulation path 47 along an extension direction of the straight flow path 45" means that the circulation path is formed so that a flow of gas in the straight flow path 45 and a flow of gas in the circulation path 47 occur on the same plane.

As will be described later, particles as foreign substances enter the circulation path 47 together with the gas supplied from the straight flow path 45. If the circulation path 47 were configured to circulate gas in the horizontal direction, a wall surface that forms the circulation path 47 would be provided to face a downstream end of the straight flow path 45. In that case, the particles entering the circulation path 47 from the straight flow path 45 together with the gas flow may collide with and rebound from the wall surface, and may return to the straight flow path 45. Thus, there is a possibility that the particles are discharged from the gas discharge ports 46 to the wafers W. In order to collect the foreign substances in the circulation path 47 by suppressing the collision of particles against the wall surface and allowing the gas to flow, which is introduced from the straight flow path 45 into the circulation path 47, without stagnation in the circulation path 47, the circulation path 47 extends along the extension direction of the straight flow path 45 as described above.

A cavity is located at an interior of the foreign substance accommodation region forming portion 44 and is configured as a rectangular parallelepiped shaped foreign substance accommodation region 48 for accommodating foreign substances that enter the circulation path 47. As described above, the foreign substance accommodation region forming portion 44 is provided below the circulation path forming portion 43 so that the foreign substance accommodation region 48 is connected to a lower end portion of the circulation path 47. In other words, the lower end portion of the circulation path 47 extends outward and downward when the circulation path 47 is viewed in a direction perpendicular to a direction of the gas circulation, whereby the foreign substance accommodation region 48 facing the circulation path 47 is formed. In the following description, with respect to a cross direction of the circulation path 47 viewed perpendicularly to the direction of the gas circulation, the side to which the straight flow path 45 is connected will be defined as a front side, and the opposite side thereof will be defined as a rear side. The foreign substance accommodation region 48 is formed in a vertically long shape, and its height H1 is greater than its front-rear width L1.

Returning to FIGS. 1 and 2, the description will be continued. A downstream end of a pipe 51 is connected to the base end of the main body portion 42 of the gas injector 41, and an upstream end of the pipe 51 is connected to a Si raw material gas supply source 53 via a valve V1, a tank 52, and a valve V2 in the named order. In the pipe 51, a downstream end of a pipe 54 is connected to a downstream side of the valve V1, and an upstream end of the pipe 54 is connected to an $N_2$ (nitrogen) gas supply source 55 via a valve V3. With such a piping configuration, during the film forming process described later, the gas to be discharged from the gas injector 41 into the reaction vessel 11 may be switched between a Si raw material gas as a processing gas and $N_2$ gas.

Further, the Si raw material gas is stored in the tank 52 and is then discharged from the gas injector 41. That is, the Si raw material gas is supplied to and stored in the tank 52 in a state in which the valve V1 is closed and the valve V2 is opened. Thereafter, the valve V2 is closed and the valve V1 is opened to supply the Si raw material gas to the gas injector 41. The reason for storing the Si raw material gas in the tank 52 and then supplying the Si raw material gas to the gas injector 41 in this manner is to supply a large amount of Si raw material gas into the reaction vessel 11 in a short time to thereby improve the deposition rate. In the case where a large amount of gas is supplied to the gas injector 41 in a short time, as described in the Background section, particles in the gas injector 41 are easily pushed upward and are easily discharged from the upper gas discharge ports 46 to the wafers W. Therefore, it is particularly effective to provide the circulation path 47 for the collection of foreign substances as described above.

Figure 2:
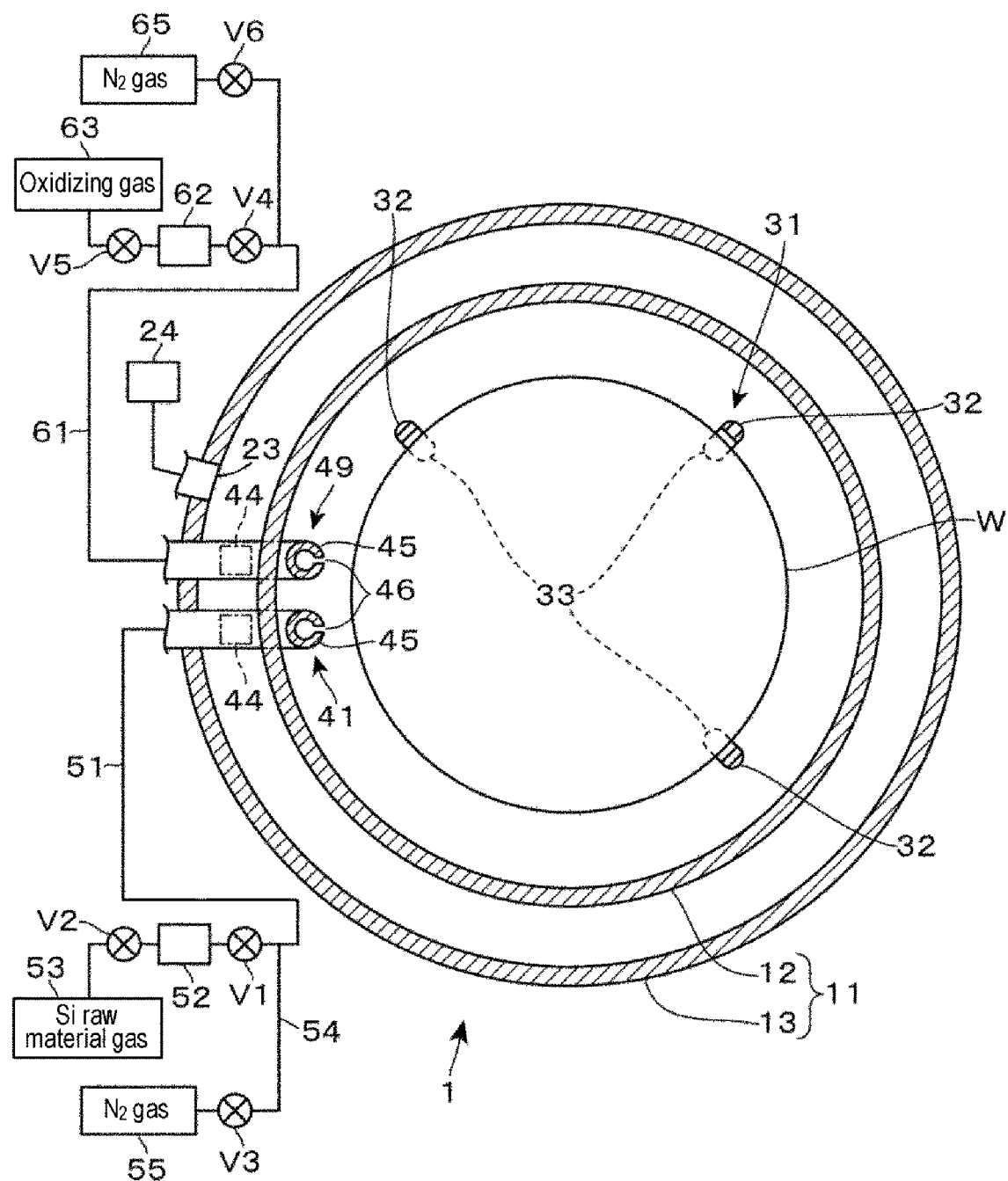
FIG. 2 is a horizontal sectional plan view of the film forming apparatus.

Reference numeral 49 in FIGS. 1 and 2 denotes a gas injector for discharging an oxidizing gas toward the wafers W. The gas injector 49 is configured in the same manner as the gas injector 41 except for the gas to be discharged toward the wafers W. As illustrated in FIG. 2, similar to the gas injector 41, the gas injector 49 discharges gas through gas discharge ports 46 from one end side of the wafers W to the other end side. That is, the gas injectors 41 and 49 are provided inside the reaction vessel 11 to discharge gas in the same direction. However, in FIG. 1, for the sake of convenience of illustration, the gas injector 49 is illustrated to be arranged to discharge a gas in a direction opposite to that of the gas injector 41.

A downstream end of the pipe 61 is connected to the base end of the main body portion 42 of the gas injector 49, and an upstream end of the pipe 61 is connected to an oxidizing gas supply source 63 via a valve V4, a tank 62, and a valve V5 in the named order. A downstream end of a pipe 64 is connected to a downstream side of the valve V4 in the pipe 61, and an upstream end of the pipe 64 is connected to an $N_2$ (nitrogen) gas supply source 65 via a valve V6. With such a piping configuration, during the film forming process to be described later, the gas discharged from the gas injector 49 into the reaction vessel 11 may be switched between the oxidizing gas as a processing gas and the $N_2$ gas. In order to improve the deposition rate, similar to the Si raw material gas, the oxidizing gas is also stored in the tank 62 and is then supplied to the gas injector 49 by opening and closing the valves V4 and V5.

The film forming apparatus 1 is provided with a control part 10 including a computer. The control part 10 is provided with a program. The program incorporates a step group to output a control signal to each part of the film forming apparatus 1 to control the operation of each part of the film forming apparatus 1 so that a series of film forming processes described later may be performed on the wafers W. The program is stored in the control part 10 in a state in which the program is stored in a storage medium such as, for example, a hard disk, a compact disk, a memory card or the like.

Next, the film forming process performed in the film forming apparatus 1 will be described. In a state in which the wafer boat 31 holding a large number of wafers W is mounted on the mounting table 18 as described above, the cover 16 rises from the lowered position toward the raised position. The wafer boat 31 is loaded into the reaction vessel 11. The reaction vessel 11 is closed by the cover 16 so that the interior of the reaction vessel 11 becomes airtight. Subsequently, the interior of the reaction vessel 11 is evacuated to a vacuum atmosphere of a predetermined pressure, and the interior of the reaction vessel 11 is heated to a predetermined temperature by the heater 22. Then, the wafer boat 31 is rotated.

An $N_2$ gas is discharged from the gas injectors 41 and 49. Thereafter, the gas discharged from the gas injector 41 is switched from the $N_2$ gas to a Si raw material gas. The Si raw material gas is adsorbed to each wafer W. Thereafter, the gas discharged from the gas injector 41 is switched from the Si raw material gas to the $N_2$ gas. That is, the $N_2$ gas is discharged from the gas injectors 41 and 49, whereby the Si raw material gas remaining in the reaction vessel 11 without being adsorbed to the wafer W is purged.

Subsequently, the gas discharged from the gas injector 49 is switched from the $N_2$ gas to an oxidizing gas, and Si in the Si raw material gas adsorbed to each wafer W is oxidized by the oxidizing gas to form a thin film of $SiO_2$. Thereafter, the gas discharged from the gas injector 41 is switched from the oxidizing gas to the $N_2$ gas. That is, the $N_2$ gas is discharged from the gas injectors 41 and 49, and the oxidizing gas remaining in the reaction vessel 11 is purged. Thereafter, a cycle including a step of causing the Si raw material to be adsorbed to the wafer W, a step of purging the interior of the reaction vessel 11, a step of oxidizing Si by the oxidizing gas and a step of purging the interior of the reaction vessel 11 is repeatedly performed to increase the film thickness of the $SiO_2$ film.

Figure 5:
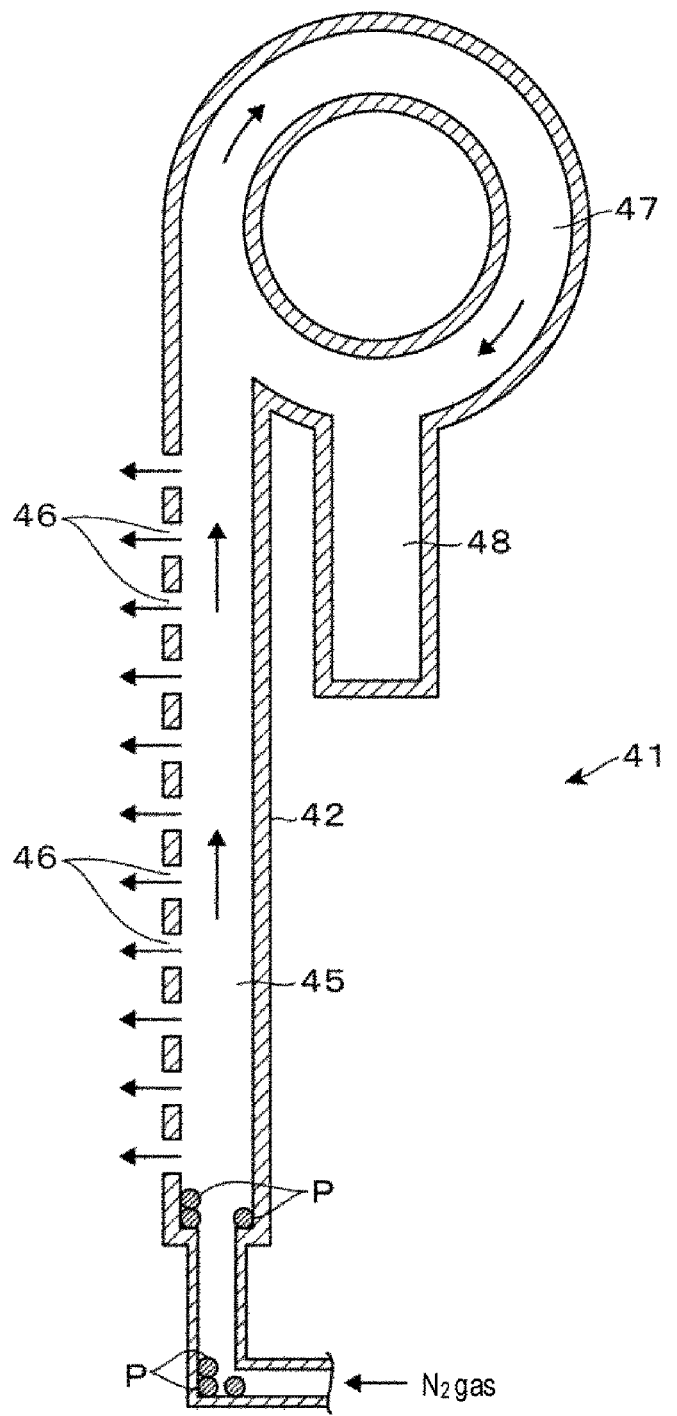
FIG. 5 is an explanatory diagram illustrating movement of particles in the gas injector.

In performing the film formation by repeating the cycle as described above, the state inside the gas injector 41 when the gas supplied from the gas injector 41 is switched from the $N_2$ gas to the Si raw material gas will be described with reference to FIGS. 5 to 10 which are vertical sectional side views of the gas injector 41. In FIGS. 5 to 10, gas flows are indicated by arrows. FIG. 5 illustrates a state in which the $N_2$ gas is discharged from the gas injector 41. At this time, it is assumed that particles P exist in the lower part inside the gas injector 41. The particles P, for example, are generated by the peeling-off of the $SiO_2$ film formed inside the gas injector 41 as described in the Background section.

Figure 6:
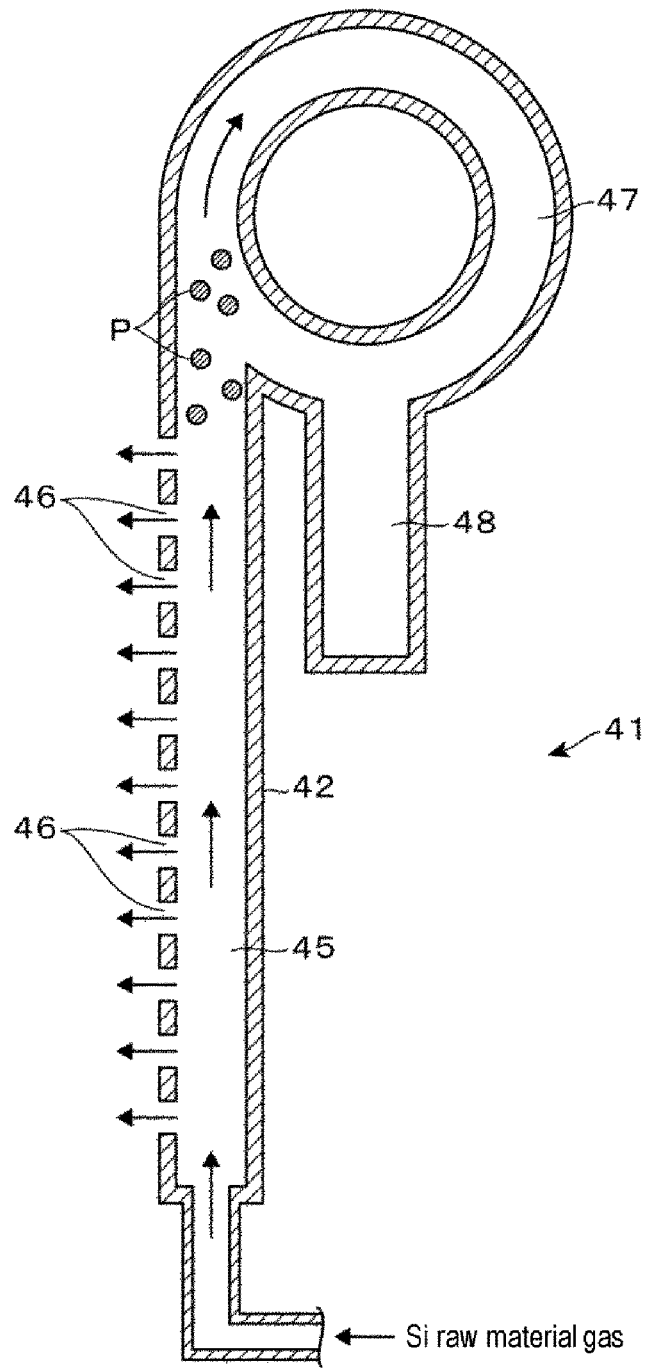
FIG. 6 is another explanatory diagram illustrating movement of particles in the gas injector.

When the Si raw material gas is supplied to the gas injector 41, as described above, the Si raw material gas is supplied from the tank 52 to the gas injector 41 at a relatively high flow rate. Therefore, the Si raw material gas is abruptly moved up in the straight flow path 45, thereby pushing the particles P upward to the upper end of the straight flow path 45. Thus, the particles P flow into the circulation path 47 together with the Si raw material gas. Then, the Si material gas is filled in the straight flow path 45 and is discharged from the gas discharge ports 46 toward the wafers W (FIG. 6).

Figure 7:
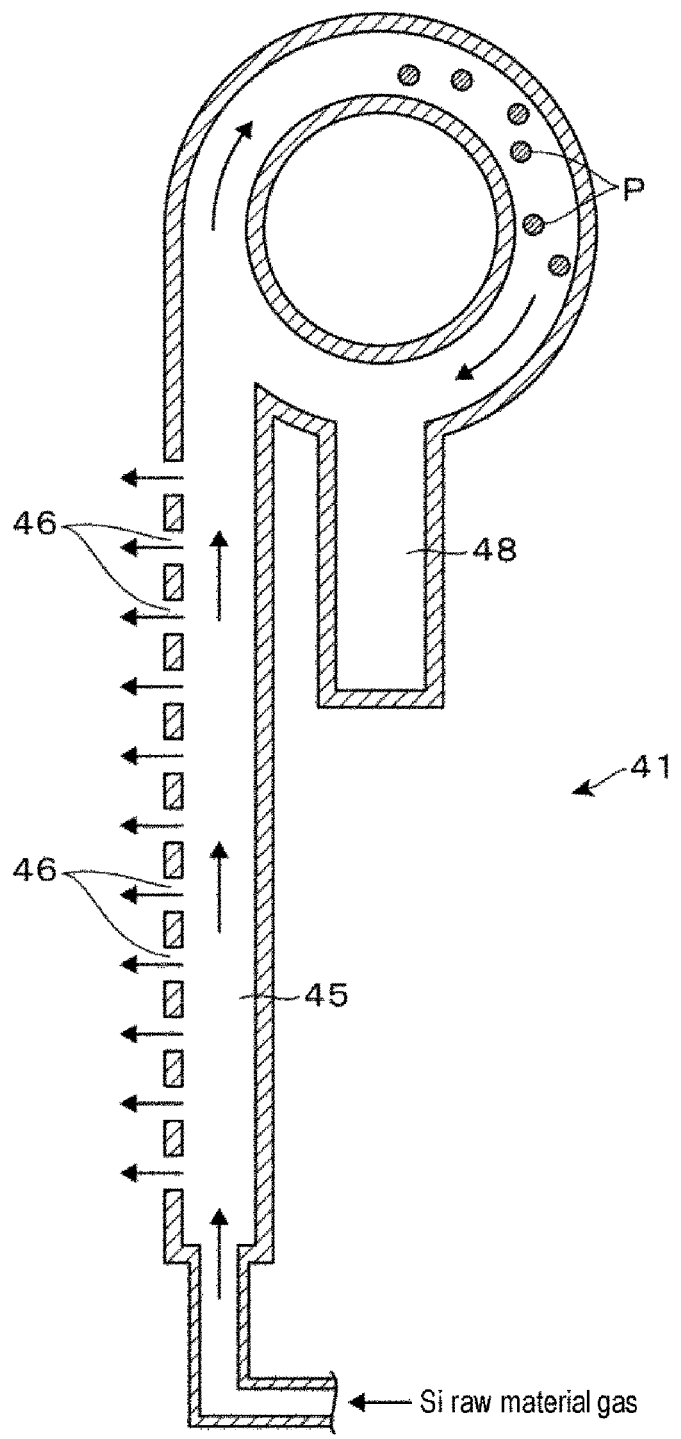
FIG. 7 is another explanatory diagram illustrating movement of particles in the gas injector.
Figure 8:
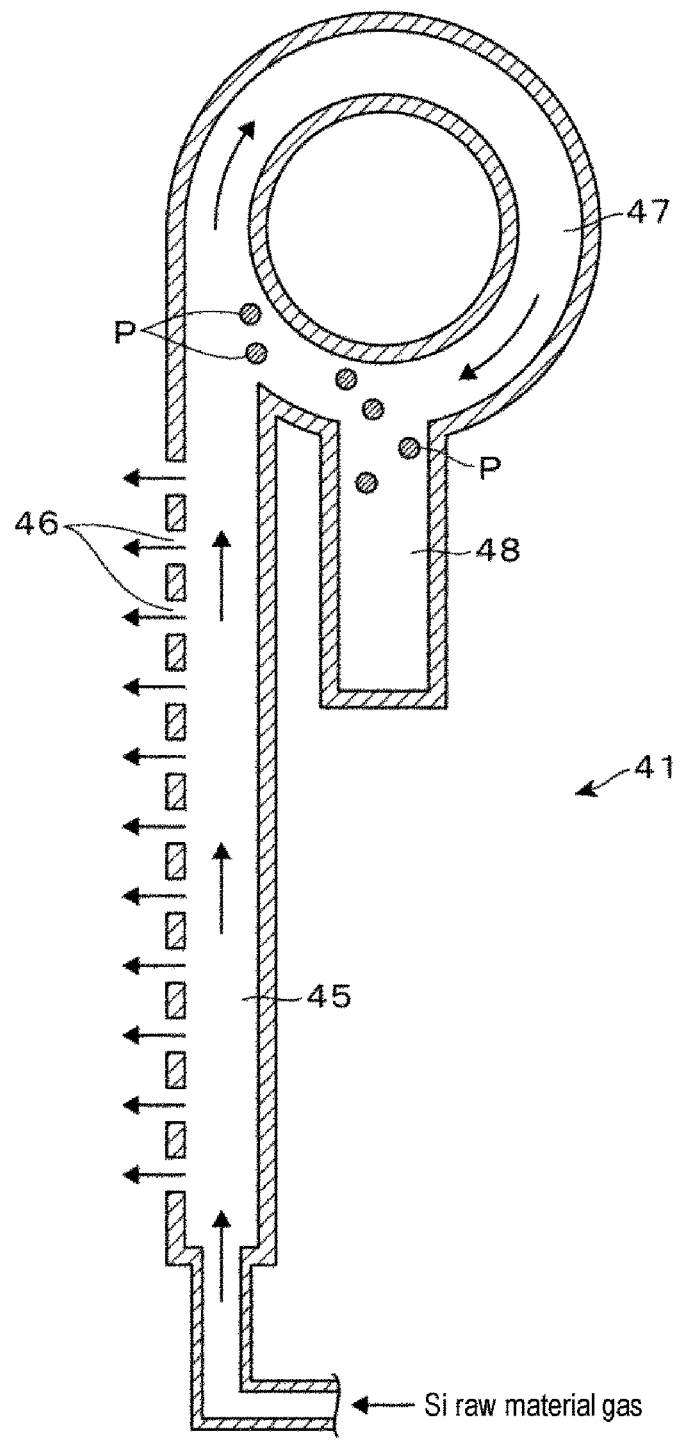
FIG. 8 is another explanatory diagram illustrating movement of particles in the gas injector.
Figure 9:
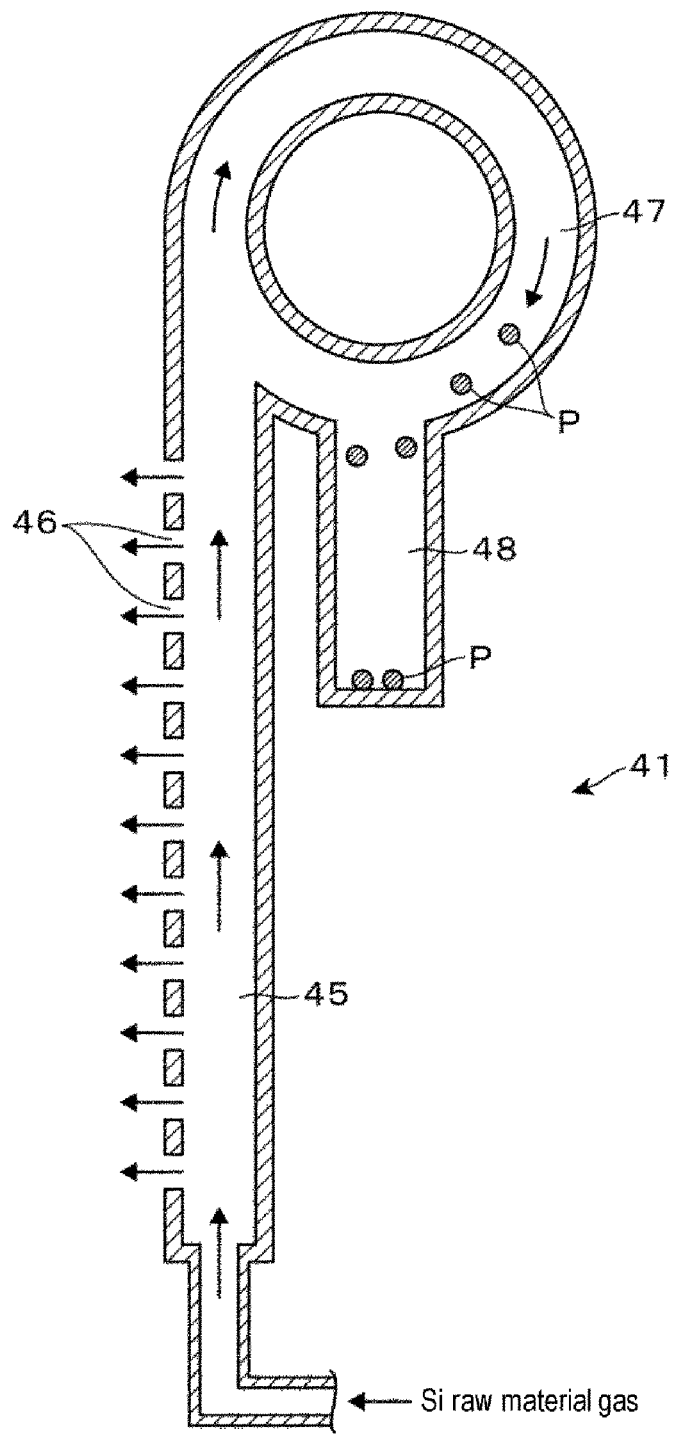
FIG. 9 is another explanatory diagram illustrating movement of particles in the gas injector.
Figure 10:
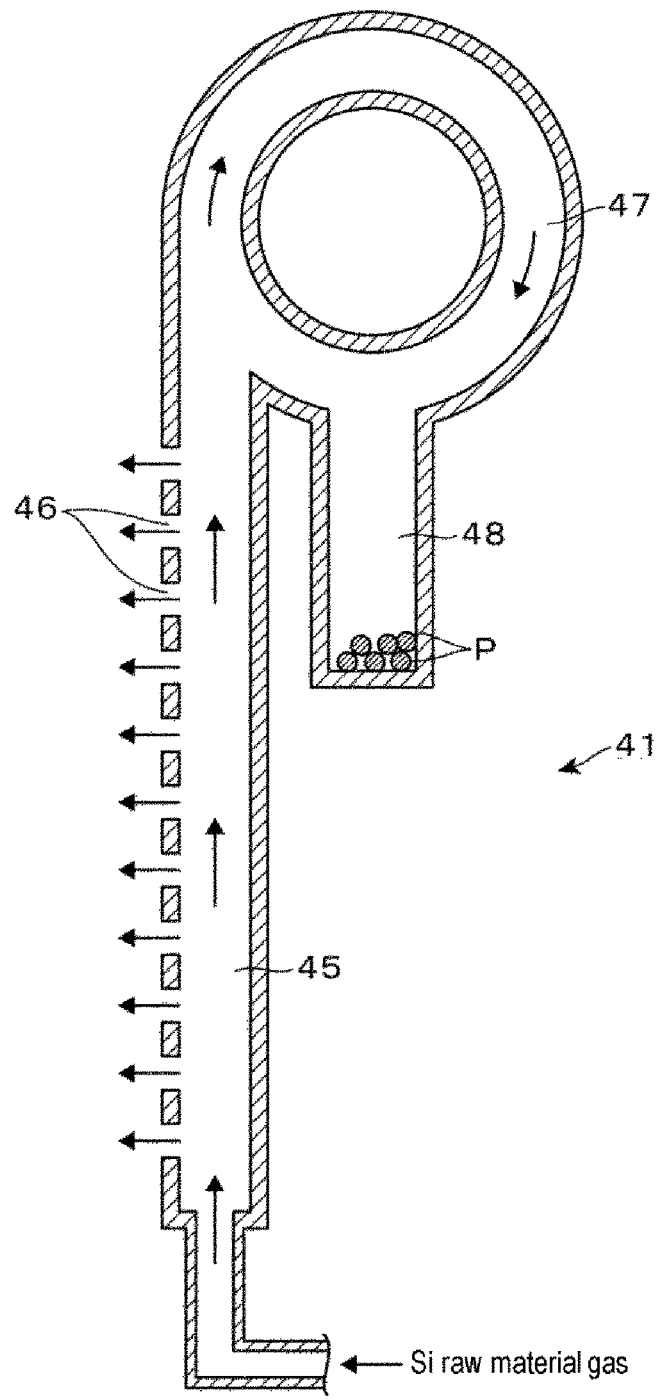
FIG. 10 is another explanatory diagram illustrating movement of particles in the gas injector.

The Si raw material gas and the particles P introduced into the circulation path 47 flow along the circulation path 47 and circulate around the circulation path 47 (FIG. 7). During this circulation, due to a centrifugal force, the particles P flow into the foreign substance accommodation region 48 formed on the outer lower side of the circulation path 47 (FIG. 8). Since the foreign substance accommodation region 48 is provided outside the circulation path 47, the flow of the Si raw material gas is suppressed in the foreign substance accommodation region 48. The particles P introduced into the foreign substance accommodation region 48 settle in the foreign substance accommodation region 48 by gravity and are accumulated at the bottom of the foreign substance accommodation region 48 (FIG. 9). As the circulation of the Si raw material gas in the circulation path 47 is continued, all the particles P introduced into the circulation path 47 are moved into the foreign substance accommodation region 48 and are accumulated (FIG. 10).

When the above cycle is performed a predetermined number of times and an $SiO_2$ film having a desired film thickness is formed on the wafer W, the discharge of the gas from the gas injectors 41 and 49 and the rotation of the wafer boat 31 are stopped. The cover 16 is moved to the lowered position, and the wafer boat 31 is unloaded from the reaction vessel 11. Thus, the film forming process is completed. In the foregoing, there has been described the case where the particles P are collected when the Si raw material gas is supplied to the gas injector 41 during the film forming process. However, similar to the Si raw material gas, the $N_2$ gas also flows through the gas injector 41. Therefore, even if the particles P exist in the gas injector 41 when the $N_2$ gas is supplied to the gas injector 41, the particles P may be collected in the circulation path 47. In addition, as described above, the gas injector 49 is configured in the same manner as the gas injector 41. The particles P may be collected when discharging the oxidizing gas and the $N_2$ gas.

According to the film forming apparatus 1 described above, the particles P in the gas injector 41 or 49 are collected in the circulation path 47 provided in the gas injector 41 or 49. Accordingly, it is possible to prevent the particles P moving upward through the straight flow path 45 from being discharged from the gas discharge ports 46 and attached to the wafers W. Incidentally, in addition to being generated in the gas injectors 41 and 49 due to peeling-off of the film as described above, the particles P may be introduced into the gas injectors 41 and 49 from the pipes connected to the upstream side of the gas injectors 41 and 49. The gas injectors 41 and 49 may collect the particles P introduced into the gas injectors 41 and 49 from the pipe in this way, just like the particles P generated by the peeling-off of the film. Accordingly, the gas injectors 41 and 49 may also be applied to gas processing apparatuses other than the film forming apparatus. Specifically, in the above film forming apparatus 1, the gas injectors 41 and 49 may discharge, for example, an etching gas or an inert gas for annealing processing, instead of discharging the processing gas for film formation, to perform etching or annealing. In this way, the apparatus having the configuration described as the film forming apparatus 1 may be used as an etching apparatus or an annealing apparatus instead of using the same as the film forming apparatus.

Figure 11:
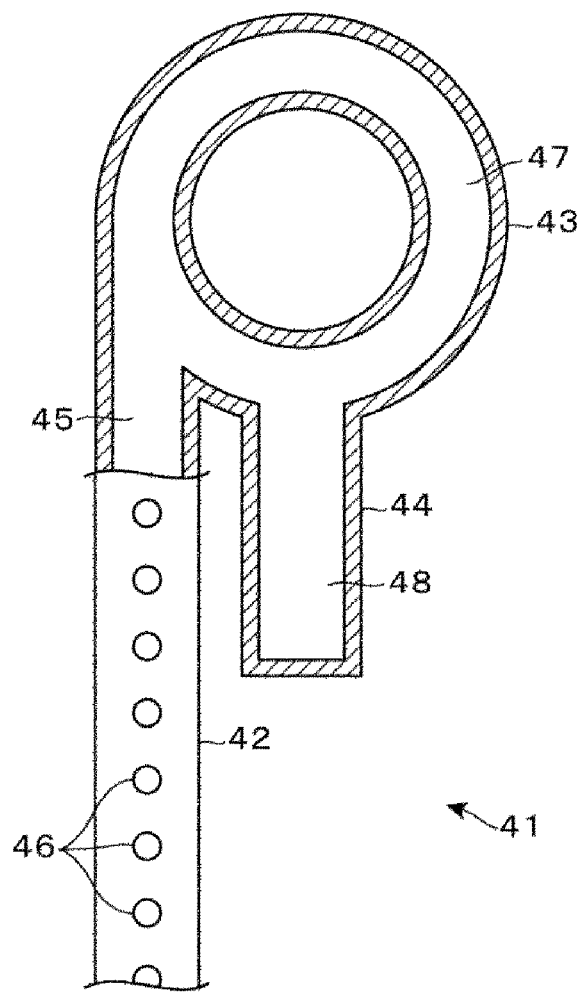
FIG. 11 is a front view illustrating another configuration example of the gas injector.

The direction in which the circulation path forming portion 43 protrudes from the main body portion 42 with respect to the opening direction of the gas discharge ports 46 when viewed from above is not limited to the opposite direction described above and may be any direction. For example, as illustrated in FIG. 11, the circulation path forming portion 43 may protrude in a direction shifted by 90 degrees with respect to the opening direction of the gas discharge ports 46, or the circulation path forming portion 43 may protrude in the same direction as the opening direction of the gas discharge ports 46. However, the circulation path forming portion 43 may be located in the space between the upper end of the inner tube 12 and the outer tube 13 as described above. By doing so, it is unnecessary to provide a dedicated installation space for the circulation path forming portion 43, and it is possible to prevent the film forming apparatus 1 from becoming larger and to prevent the apparatus configuration from becoming complex. Furthermore, by installing the circulation path forming portion 43 in this manner, it is possible to dispose the foreign substance accommodation region forming portion 44 in the space between the side wall of the inner tube 12 and the side wall of the outer tube 13 as described above. Therefore, it is unnecessary to provide a dedicated installation space for the foreign substance accommodation region forming portion 44, and it is possible to prevent the film forming apparatus 1 from becoming larger and to prevent the apparatus configuration from becoming complex. However, the reaction vessel 11 of the film forming apparatus 1 may not be configured as a double tube structure. For example, the gas injectors 41 and 49 may also be applied to a film forming apparatus in which the inner tube 12 is not provided and the reaction vessel 11 is configured only by a member corresponding to the outer tube 13.

Figure 12:
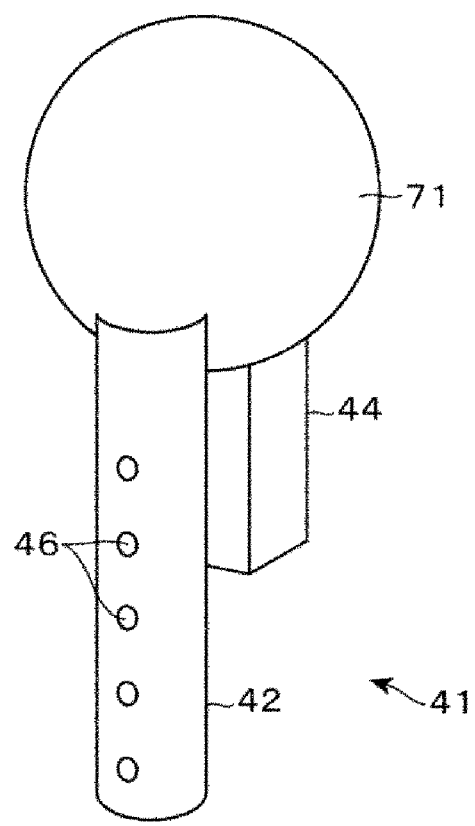
FIG. 12 is a perspective view illustrating the configuration example of the gas injector.
Figure 13:
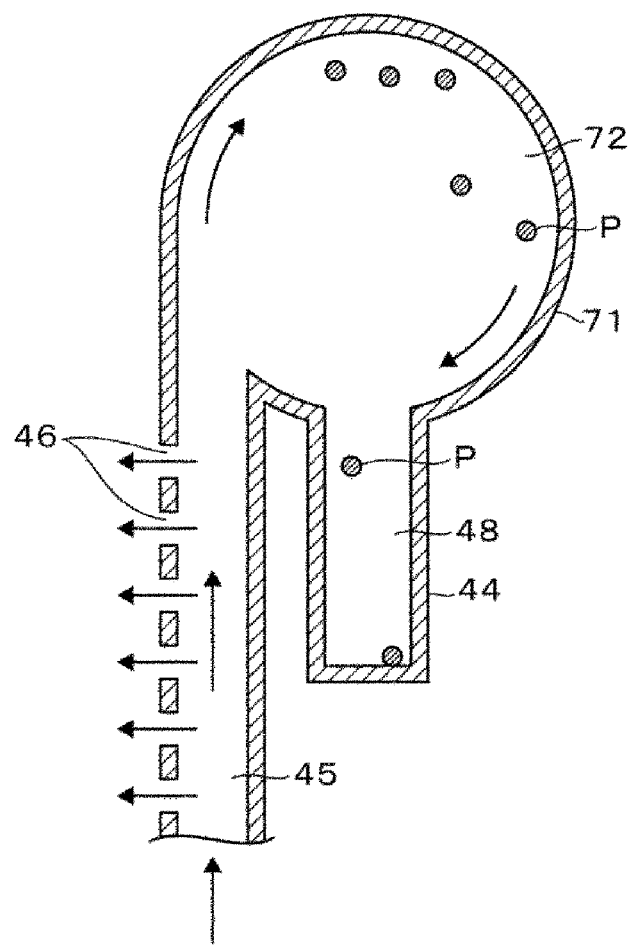
FIG. 13 is a vertical sectional side view illustrating the configuration example of the gas injector.

Incidentally, the circulation path forming portion is not limited to being configured like the circulation path forming portion 43 described above. The perspective view of FIG. 12 and the vertical sectional side view of FIG. 13 illustrate an example in which instead of the circulation path forming portion 43, a spherical circulation path forming portion 71 is provided above the main body portion 42 of the gas injector 41. A cavity is located at the interior of the circulation path forming portion 71 and constitutes a spherical space 72. When viewed in a longitudinal cross section passing through the center of the spherical space 72, a straight flow path 45 is connected to one lateral end portion of the spherical space 72 from below. Accordingly, the gas supplied from the straight flow path 45 flows in a direction extending from the straight flow path 45 along the peripheral wall of the spherical space 72 as indicated by arrows in FIG. 13 and circulates through the spherical space 72. That is, the spherical space 72 is configured as a circulation path extending along the extension direction of the straight flow path 45.

As described above, in the circulation path forming portion 71, unlike the circulation path forming portion 43, when viewed in a cross section taken along the gas circulation direction, there is no partition for partitioning the central portion from the peripheral portion. In other words, such a partition may be provided or may not be provided. Accordingly, the circulation path forming portion may be formed as a circular ring or a sphere having a cavity in the interior just like the circulation path forming portions 43 and 71, or may be configured by, for example, an upright disk-shaped member having a cavity in the interior. In the circulation path forming portions 43 and 71, the circulation path may be formed to draw a substantially perfect circle. However, the circulation path may be formed to draw an ellipse.

Figure 14:
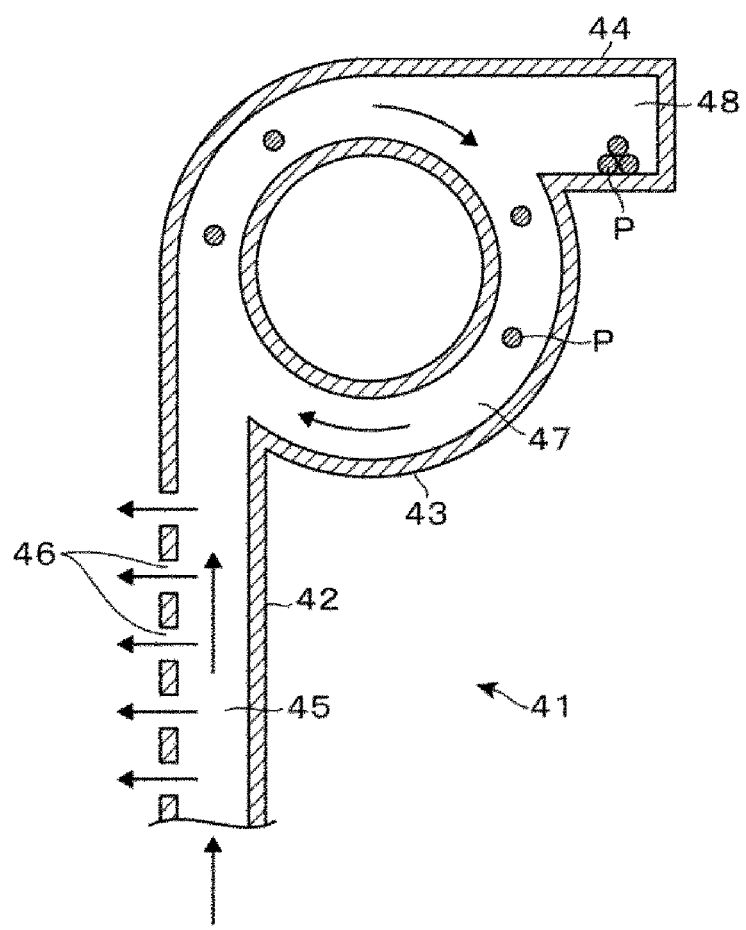
FIG. 14 is a vertical sectional side view illustrating another configuration example of the gas injector.

Incidentally, in order to allow the particles P flowing through the circulation path to enter the foreign substance accommodation region 48 by a centrifugal force as described above, it is only necessary that the foreign substance accommodation region 48 is configured so that a portion of the circulation path protrudes outward when the circulation path is viewed in a direction orthogonal to the gas circulation direction. Accordingly, the foreign substance accommodation region 48 is not limited to being provided below the circulation path 47. The gas injector 41 illustrated in FIG. 14 differs from the gas injector 41 described with reference to FIGS. 1 to 4 in terms of the position where the foreign substance accommodation region forming portion 44 is provided. In the circulation path 47 of the gas injector 41 illustrated in FIG. 14, the foreign substance accommodation region forming portion 44 is provided as the rear upper portion of the circulation path 47 and extends rearward to form a foreign substance accommodation region 48. Even in the foreign substance accommodation region 48 formed in this manner, the particles P accommodated therein settle toward the bottom of the foreign substance accommodation region 48 by gravity as illustrated in FIG. 14.

Figure 15:
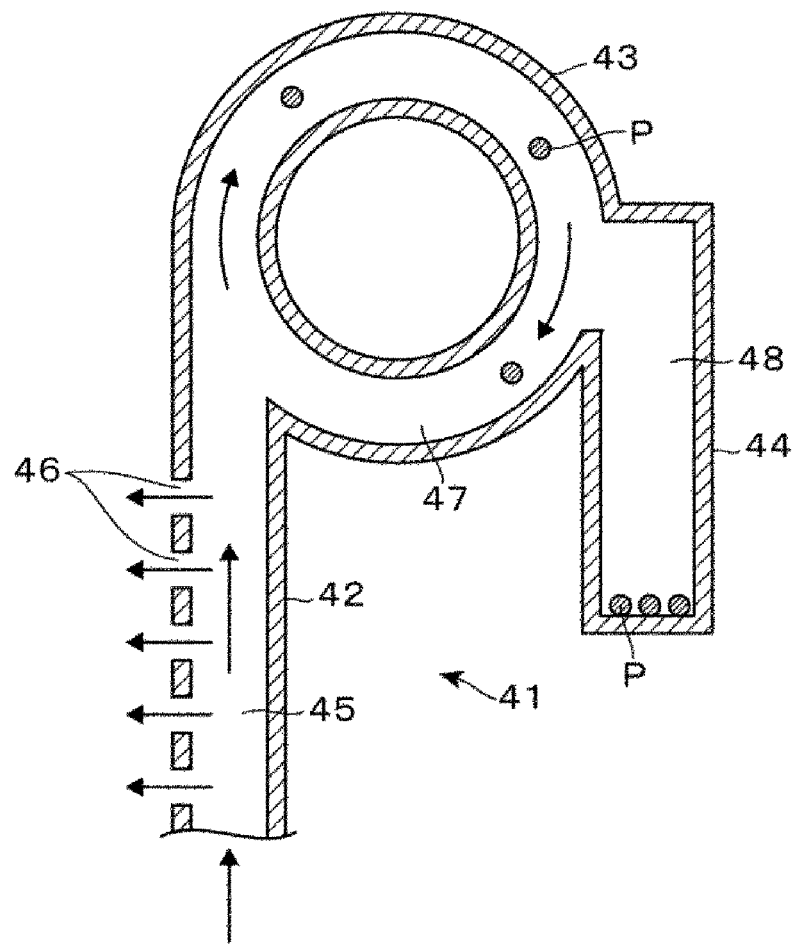
FIG. 15 is a vertical sectional side view illustrating another configuration example of the gas injector.

The gas injector 41 illustrated in FIG. 15 also differs from the gas injector 41 described with reference to FIGS. 1 to 4 in terms of the position of the foreign substance accommodation region forming portion 44. In the gas injector 41 illustrated in FIG. 15, the foreign substance accommodation region forming portion 44 is provided as the vertical central portion of the rear end of the circulation path 47 is drawn toward rearward and then extends downward to form a foreign substance accommodation region 48.

Figure 16:
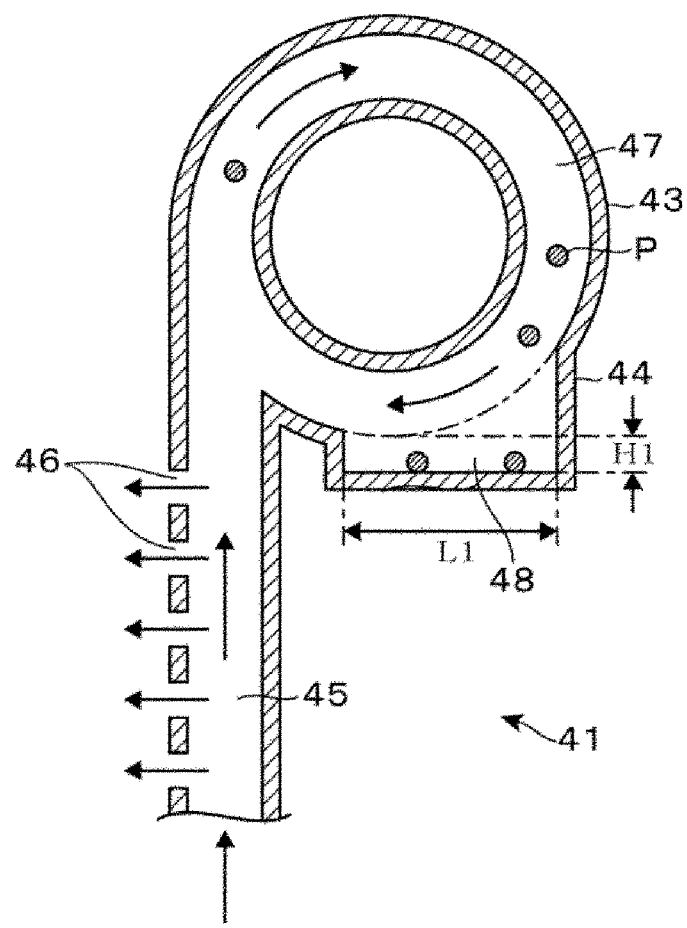
FIG. 16 is a vertical sectional side view illustrating another configuration example of the gas injector.

As in the gas injector 41 illustrated in FIG. 16, a foreign substance accommodation region 48 may be formed such that the front-rear width L1 is larger than the height H1. However, the height H1 may be increased in order to prevent the particles P entering the foreign substance accommodation region 48 by the centrifugal force from colliding with the foreign substance accommodation region 48 and returning to the circulation path 47. Furthermore, if the front-rear width L1 is too large, the gas flow in the circulation path 47 may flow into the foreign substance accommodation region 48, and the accommodated foreign substances may be swirled up into the circulation path 47. Accordingly, as in the gas injector 41 illustrated in FIGS. 1 to 4, for example, the front-rear width L1 may be smaller than the height H1. For example, the height H1 may be three times or more as large as the front-rear width L1. The foreign substance accommodation region 48 is not limited to being formed in a rectangular parallelepiped shape and may be formed in, for example, a shape broadening toward the end, to accommodate many foreign substances. In this case, the front-rear width L1 is the front-rear width at the position where the foreign substance accommodation region 48 is connected to the circulation path 47.

Figure 17:
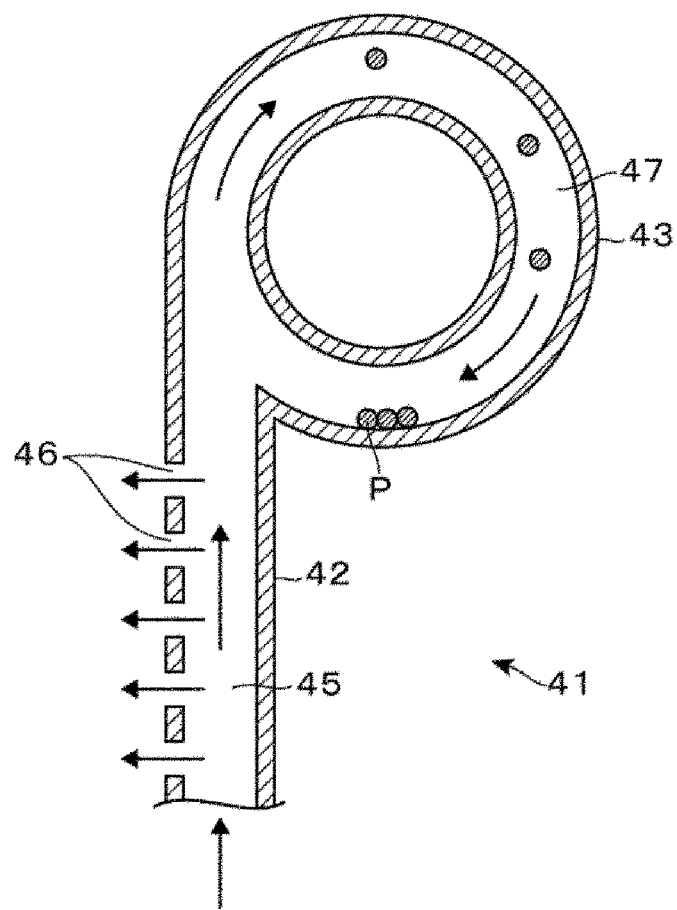
FIG. 17 is a vertical sectional side view illustrating another configuration example of the gas injector.

Further, the gas injector 41 illustrated in FIG. 17 differs from the gas injector 41 described with reference to FIGS. 1 to 4 in that no foreign substance accommodation region 48 is provided. While the gas is supplied to the gas injector 41 at a relatively large flow rate, the particles P introduced into the circulation path 47 as described above are also introduced into the gas flow and circulate through the circulation path 47. If the flow rate of the gas supplied to the gas injector 41 becomes relatively small, the particles P settle toward the bottom of the circulation path 47 through gravity and accumulate. In other words, even if the foreign substance accommodation region 48 is not provided, the particles P are collected in the circulation path 47 and are prevented from being discharged from the gas discharge ports 46. Therefore, the foreign substance accommodation region 48 may not be provided. However, in order to more reliably prevent the particles P from returning to the straight flow path 45 from the circulation path 47 and from being discharged from the gas discharge ports 46, the foreign substance accommodation region 48 may be used.

Figure 18:
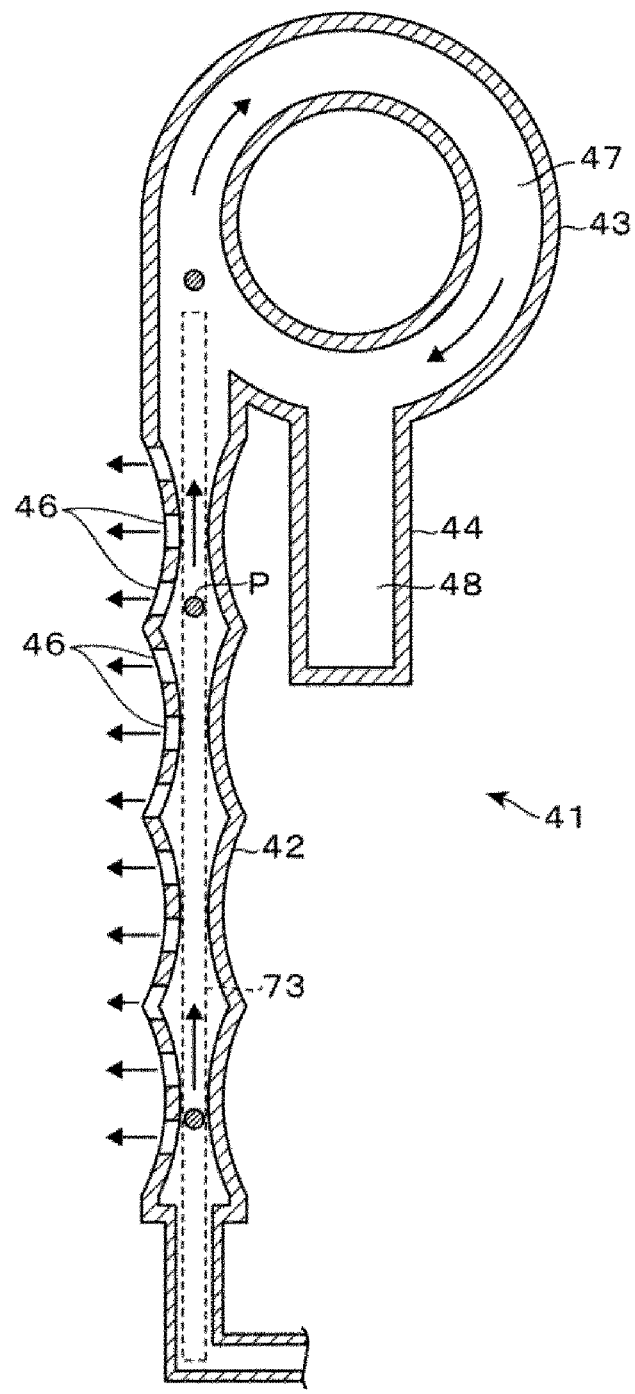
FIG. 18 is a vertical sectional side view illustrating another configuration example of the gas injector.

If a space is formed from the downstream side of the region where the gas discharge ports 46 are formed to the entrance of the circulation path 47, and is not shielded when viewed in a straight line direction, the particles P introduced into the gas flow may be introduced into the circulation path 47 via the space with no collision with the wall surface of the flow path and may be collected. Specifically, in the example illustrated in FIG. 18, when the vertically extending region of the main body portion 42 is viewed in a vertical cross section, the wall portion forming the flow path is wavy and is not straight. However, a space (indicated by a dotted line frame 73 in FIG. 18), which is not shielded as viewed in the aforementioned straight line direction, is formed in the central portion of the flow path. This space corresponds to a straight flow path. That is, the straight flow path is not limited to being formed by the flow path forming member having a linear cross section.

Figure 19:
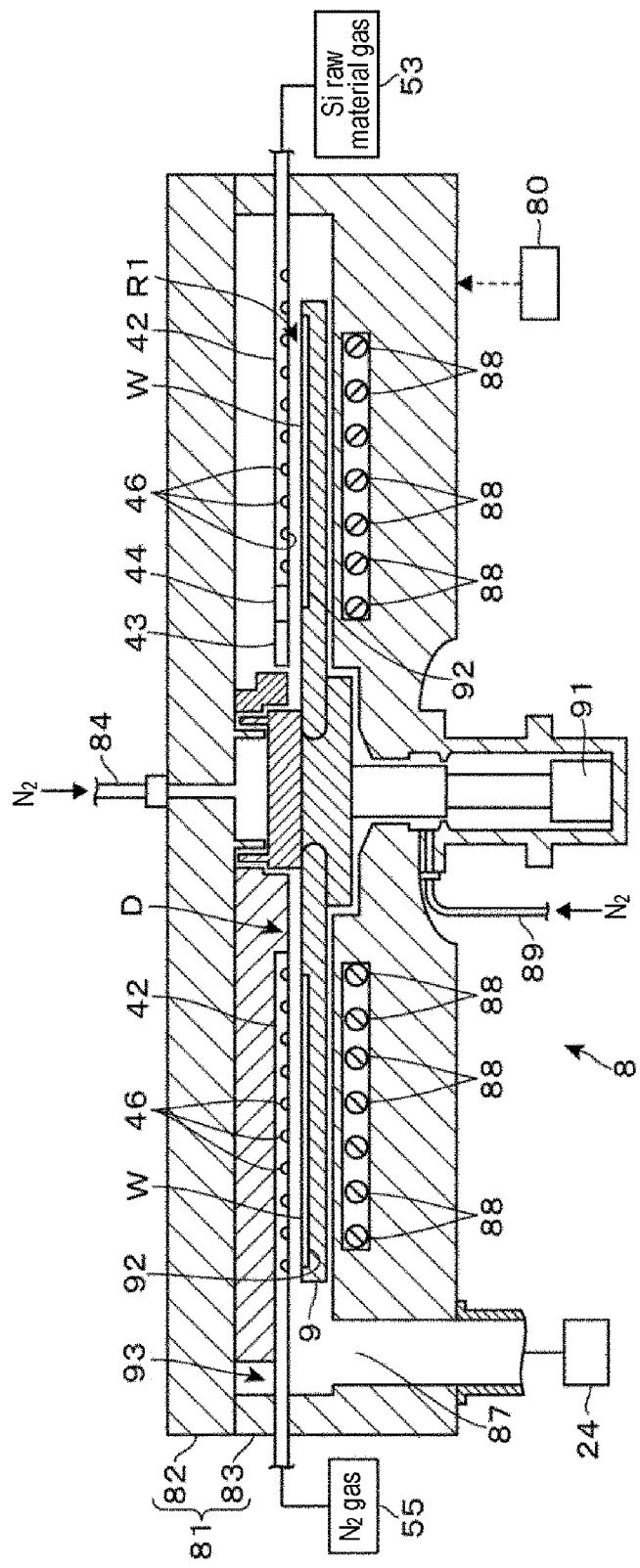
FIG. 19 is a vertical sectional side view of another film forming apparatus to which the gas injector of the present disclosure is applied.
Figure 20:
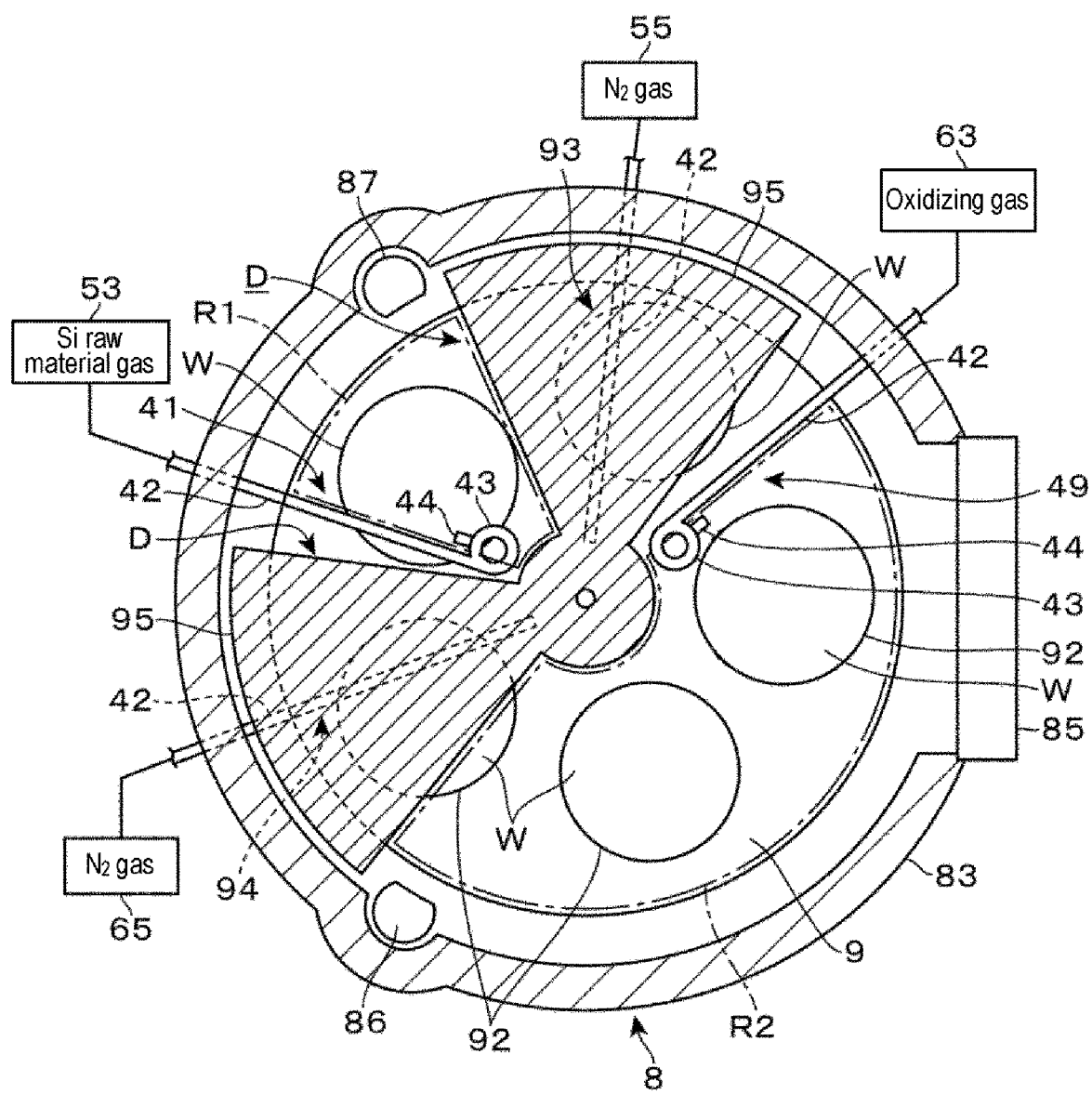
FIG. 20 is a horizontal sectional plan view of the film forming apparatus.

Incidentally, the gas injectors 41 and 49 are not limited to being applied to a vertical processing apparatus such as the film forming apparatus 1 described above or the like. FIGS. 19 and 20 illustrate a vertical sectional side view and a horizontal sectional plan view, respectively, of another film forming apparatus 8 to which the gas injectors 41 and 49 are applied. The film forming apparatus 8 is also configured to form a SiO$_2$ film on a wafer W by ALD. In FIGS. 19 and 20, the same constituent parts of the film forming apparatus 8 as those of the film forming apparatus 1 are denoted by the same reference numerals as those used in the film forming apparatus 1, and a description thereof will be omitted.

The film forming apparatus 8 includes a reaction vessel 81 having a flat shape. The reaction vessel 81 is formed in a substantially circular shape when seen in a plan view and is constituted by a top plate 82 and a vessel body 83 that forms a side wall and a bottom portion of the reaction vessel 81. Reference numeral 84 in FIGS. 19 and 20 denotes a gas supply pipe. The gas supply pipe 84 is configured to supply an N$_2$ gas onto the central portion of a horizontal rotary table 9 provided inside the reaction vessel 81, thereby preventing a Si source gas and an oxidizing gas discharged from gas injectors 41 and 49 from being mixed with each other.

The rotary table 9 is formed in a circular shape in a plan view and is rotated clockwise in a plan view about the central axis thereof as a rotation axis by a rotation mechanism 91. For example, five recesses 92 are formed along the rotation direction on the front surface side (one surface side) of the rotary table 9. Wafers W are mounted in the recesses 92. In FIG. 20, reference numeral 85 denotes a gate valve that opens and closes a wafer transfer port provided on the side wall of the reaction vessel 81. Exhaust ports 86 and 87 connected to a vacuum pump 24 via a pressure regulation part (not illustrated) are provided below the outer peripheral side of the rotary table 9. In FIG. 19, reference numeral 88 denotes a heater for heating the rotary table 9 and the wafers W. Reference numeral 89 denotes a purge gas supply pipe for supplying an N$_2$ gas to purge the lower side of the rotary table 9.

Above the rotary table 9, a gas injector 41, a gas injector 93, a gas injector 49 and a gas injector 94 are arranged clockwise in the named order. The arrangement of the gas injector 41 will be described in detail. The base end side of a main body portion 42 is located outside the reaction vessel 81, and the distal end side of the main body portion 42 in which the aforementioned straight flow path 45 is formed penetrates the side wall of the reaction vessel 11 and horizontally extends along the radial direction of the rotary table 9 toward the center of the rotary table 9 inside the reaction vessel 11. In other words, the main body portion 42 extends on the radius of the rotary table 9 to intersect the rotation direction of the rotary table 9. The gas discharge ports 46 of the main body portion 42 face downward and may supply a gas entirely to all surfaces of the wafers W rotated by the rotary table 9.

Similar to the gas injector 41, the remaining gas injectors 49, 93 and 94 are also arranged to discharge a gas from the gas discharge ports 46 entirely to all surfaces of the wafers W. The base ends of the gas injectors 93 and 94 are connected to N$_2$ gas supply sources 55 and 65, respectively, and are configured to discharge an N$_2$ gas as a separation gas for separating the processing atmosphere of the gas injector 41 from the processing atmosphere of the gas injector 49. Although there is illustrated an example in which the gas injectors 93 and 94 are not provided with the circulation path forming portion 43 and the foreign substance accommodation region forming portion 44, it may be possible to employ a configuration in which the circulation path forming portion 43 and the foreign substance accommodation region forming portion 44 are provided.

Two protrusion portions 95 having a fan-like shape in a plan view are provided under the top plate 82 of the reaction vessel 81 to protrude downward from the top plate 82, and the gas injectors 93 and 94 are embedded in the protrusion portions 95, respectively. As an N$_2$ gas is discharged from the gas injectors 93 and 94, the lower sides of the protrusion portions 95 constitute separation regions D for preventing the mixing of a Si raw material gas and an oxidizing gas spreading in the circumferential direction of the rotary table 9. In FIG. 19, reference numeral 80 denotes a control part which is configured similarly to the control part 10 of the film forming apparatus 1 and which controls the operation of the film forming apparatus 8.

In the film forming apparatus 8 described above, the interior of the reaction vessel 81 is evacuated to a vacuum atmosphere of a predetermined pressure. In this state, the wafers W are heated by the heater 88, and the rotary table 9 is rotated. Then, the Si raw material gas is discharged from the gas injector 41, the oxidizing gas is discharged from the gas injector 49, and the $N_2$ gas is simultaneously discharged from the gas injectors 93 and 94 and the gas supply pipes 84 and 89. By the $N_2$ gas thus discharged, the atmosphere in a processing region R1 to which the Si source gas is discharged and the atmosphere in a processing region R2 to which the oxidizing gas is discharged are separated from each other on the rotary table 9. As the rotary table 9 rotates, the wafers W alternately and repeatedly pass through the processing regions R1 and R2, whereby the adsorption of the Si raw material gas and the oxidation of Si are alternately repeated to form an $SiO_2$ film on the surface of each of the wafers W.

Even in such a film forming apparatus 8, the particles P existing in the straight flow path 45 are collected in the circulation path 47 inside the gas injectors 41 and 49. This makes it possible to prevent the particles P from being discharged onto the wafers W. Accordingly, the film forming apparatus 8 may achieve the same effects as those of the film forming apparatus 1. Similar to the film forming apparatus 1, the film forming apparatus 8 may be configured so that the gas injectors 41 and 49 may discharge an etching gas or an inert gas for annealing processing instead of discharging the processing gas for film formation, and may be used as an etching apparatus or an annealing apparatus. In the case of using the film forming apparatus 8 as an annealing apparatus, the aforementioned separation region D may not be formed.

As illustrated in the examples applied to the film forming apparatuses 1 and 8, the straight flow path 45 of each of the gas injectors 41 and 49 may be formed in the vertical direction or may be formed in the horizontal direction. Incidentally, the vertical direction and the horizontal direction include oblique directions besides the vertical direction and the horizontal direction. Further, the gas discharge ports 46 are not limited to being formed in a direction orthogonal to the straight flow path 45 and may be formed obliquely with respect to the straight flow path 45. Furthermore, the gas discharge ports 46 are not limited to being provided in a plural number. Only one gas discharge port 46 may be provided. Moreover, in the film forming apparatuses 1 and 8, the Si raw material gas and the oxidizing gas are supplied as the processing gases to the wafers W so as to form the $SiO_2$ film. Further, processing gas for forming a film other than the $SiO_2$ film, such as a metal film or the like, may be supplied. In addition, the present disclosure is not limited to the apparatus for performing film formation by ALD. The gas injectors 41 and 49 may also be applied to an apparatus for performing film formation by CVD. The present disclosure is not limited to the embodiments described above. The respective embodiments may be appropriately changed or combined.

[Evaluation Test]

Evaluation tests conducted in connection with the present disclosure will be described.

Evaluation Test 1

By way of simulation, the state of particles on the upper side in a test-purpose gas injector when a gas is supplied into the gas injector in a state in which a large number of particles remain inside the gas injector was investigated. This test-purpose gas injector has the same structure as the previously described gas injector 41 except that the circulation path forming portion 43 and the foreign substance accommodation region forming portion 44 are not provided and the upper end of the main body portion 42 is closed. Assuming that the timing at which the valve V1 on the downstream side of the tank 52 is opened is a reference time, the number of particles existing on the upper side inside the test-purpose gas injector after 0.003 sec, 0.005 sec and 0.01 sec from the reference time were 115, 96 and 74, respectively. That is, it was confirmed that the particles are discharged together with the gas from the gas discharge ports 46 on the upper side of the test-purpose gas injector.

Evaluation Test 2

The same test as in evaluation test 1 was conducted by way of simulation. In evaluation test 2, the gas injector 41 was used instead of the test-purpose gas injector. As a result, as described in the Detailed Description, it was confirmed that the particles are collected in the circulation path 47, accommodated in the foreign substance accommodation region 48 and settled toward the bottom of the foreign substance accommodation region 48, whereby the particles are not discharged from the gas discharge ports 46.

According to the present disclosure, the gas circulation path extends along the extension line of the straight flow path to be connected to a second end of the straight flow path to which the gas is supplied from a first end of the straight flow path. By collecting the foreign substances in the circulation path, it is possible to prevent the foreign substances from being discharged from the gas discharge ports branched from the straight flow path.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supply member, comprising:
    a straight flow path having a straight-line shape and including a first end to be supplied with gas;
    a gas discharge port branched from the straight flow path;
    a gas circulation path extending along an extension line of the straight flow path, connected to a second end of the straight flow path, and configured to collect foreign substances contained in the gas supplied to the straight flow path; and
    a foreign substance accommodation region arranged to face the gas circulation path,
    wherein the foreign substance accommodation region is configured by a portion of the gas circulation path that extends in a direction outward of the gas circulation path when viewed in a direction orthogonal to a circulation direction of the gas,
    wherein a distal end of the portion is closed so that the foreign substances are accommodated at the distal end,
    wherein a wall portion forming the straight flow path has a wave shape, and
    wherein a space is formed in the straight flow path from a downstream of the gas discharge port to an entrance of the gas circulation path without being shielded in a direction of the straight flow path.

2. The gas supply member of claim 1, wherein the straight flow path extends in a vertical direction, the gas circulation path is configured to circulate the gas in the vertical direction, and the foreign substance accommodation region is located at a lower portion of the gas circulation path.

3. The gas supply member of claim 1, wherein the gas circulation path has an annular shape when viewed in the direction orthogonal to the circulation direction of the gas.

4. A gas processing apparatus that performs processing, in a vertical reaction vessel in which a vacuum atmosphere is formed, by heating a plurality of substrates held in a shelf shape on a substrate holder and supplying a processing gas to the substrates, comprising:
- a gas supply member including a straight flow path having a straight-line shape along a vertical direction and a first end to be supplied with the processing gas, a gas discharge port branched from the straight flow path and having an opening facing a horizontal direction, a processing gas circulation path extending along an extension line of the straight flow path, connected to a second end of the straight flow path and configured to collect foreign substances contained in the processing gas supplied to the straight flow path, and a foreign substance accommodation region arranged to face the processing gas circulation path, wherein the foreign substance accommodation region is configured by a portion of the processing gas circulation path that extends in a direction outward of the processing gas circulation path when viewed in a direction orthogonal to a circulation direction of the processing gas,
- wherein a distal end of the portion is closed so that the foreign substances are accommodated at the distal end,
- wherein a wall portion forming the straight flow path has a wave shape, and
- wherein a space is formed in the straight flow path from a downstream of the gas discharge port to an entrance of the processing gas circulation path without being shielded in a direction of the straight flow path.

5. The gas processing apparatus of claim 4, wherein the reaction vessel is a double tube including:
- an inner tube opened on an upper side; and
- an outer tube configured to surround the inner tube and provided with a ceiling of the reaction vessel,
- wherein the straight flow path is provided inside the inner tube, and
- wherein the processing gas circulation path is provided between an upper end of the inner tube and the ceiling of the outer tube.

6. The gas processing apparatus of claim 5, wherein the foreign substance accommodation region is provided between a side wall of the inner tube and a side wall of the outer tube.

7. A gas processing apparatus that performs processing, in a reaction vessel in which a vacuum atmosphere is formed, by supplying a processing gas to a substrate mounted on one surface side of a rotary table and heating the substrate, comprising:
- a gas supply member including a straight flow path having a straight-line shape to extend in a direction intersecting with a rotation direction of the rotary table on one side of the rotary table and a first end to be supplied with the processing gas from, a gas discharge port branched from the straight flow path and having an opening facing the one side of the rotary table, a processing gas circulation path extending along an extension line of the straight flow path, connected to a second end of the straight flow path, and configured to collect foreign substances contained in the processing gas supplied to the straight flow path, and a foreign substance accommodation region arranged to face the processing gas circulation path,
- wherein the foreign substance accommodation region is configured by a portion of the processing gas circulation path that extends in a direction outward of the processing gas circulation path when viewed in a direction orthogonal to a circulation direction of the processing gas,
- wherein a distal end of the portion is closed so that the foreign substances are accommodated at the distal end,
- wherein a wall portion forming the straight flow path has a wave shape, and
- wherein a space is formed in the straight flow path from a downstream of the gas discharge port to an entrance of the processing gas circulation path without being shielded in a direction of the straight flow path.

* * * * *